US009252036B2

(12) United States Patent
Furuichi et al.

(10) Patent No.: US 9,252,036 B2
(45) Date of Patent: Feb. 2, 2016

(54) SUBSTRATE TRANSFER SYSTEM, SUBSTRATE PROCESSING SYSTEM, AND SUBSTRATE TRANSFER ROBOT

(71) Applicant: KABUSHIKI KAISHA YASKAWA DENKI, Kitakyushu-shi (JP)

(72) Inventors: Masatoshi Furuichi, Kitakyushu (JP); Yoshiki Kimura, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 0 days.

(21) Appl. No.: 14/810,409

(22) Filed: Jul. 27, 2015

(65) Prior Publication Data

US 2015/0332947 A1     Nov. 19, 2015

Related U.S. Application Data

(62) Division of application No. 14/073,871, filed on Nov. 7, 2013.

(60) Provisional application No. 61/724,435, filed on Nov. 9, 2012.

(51) Int. Cl.
*H01L 21/677*     (2006.01)

(52) U.S. Cl.
CPC .... *H01L 21/67706* (2013.01); *H01L 21/67715* (2013.01)

(58) Field of Classification Search
CPC ............ H01L 21/677; H01L 21/67703; H01L 21/67739; H01L 21/67201; H01L 21/67748; H01L 21/67196; B25J 9/042; Y10S 414/137
USPC ............................................. 414/226.05, 937
See application file for complete search history.

(56) References Cited

U.S. PATENT DOCUMENTS

| | | |
|---|---|---|
| 5,695,564 A | 12/1997 | Imahashi |
| 6,364,592 B1 | 4/2002 | Hofmeister |

(Continued)

FOREIGN PATENT DOCUMENTS

| | | |
|---|---|---|
| JP | 64-500072 | 1/1989 |
| JP | 2008-028134 | 2/2008 |

(Continued)

OTHER PUBLICATIONS

Japanese Office Action for corresponding JP Application No. 2010-267136, Jan. 15, 2013.

(Continued)

*Primary Examiner* — Saul Rodriguez
*Assistant Examiner* — Mark Hageman
(74) *Attorney, Agent, or Firm* — Mori & Ward, LLP

(57) ABSTRACT

A substrate transfer system includes a substrate transfer robot disposed in a robot installment area defined between a first apparatus and a second apparatus. The first apparatus includes a first cassette, a second cassette and a first wall. The second apparatus includes a second wall. The substrate transfer robot transfers a substrate from each of the first cassette and the second cassette to the second apparatus. The substrate transfer robot includes a hand and an arm. The arm includes a first arm rotatable about a center of rotation. The first cassette is closer to the center of rotation than the second cassette. The arm moves with being partially disposed beyond the second wall in plan view and the arm moves without being disposed beyond the second wall in plan view when taking out the substrate from the first cassette.

22 Claims, 10 Drawing Sheets

(56) References Cited

U.S. PATENT DOCUMENTS

| | | |
|---|---|---|
| 6,485,250 B2 | 11/2002 | Hofmeister |
| 6,927,181 B2 | 8/2005 | Wakizako et al. |
| 7,874,782 B2 | 1/2011 | Hashimoto |
| 2001/0043856 A1 | 11/2001 | Woodruff et al. |
| 2003/0082466 A1 | 5/2003 | del Puerto et al. |
| 2003/0202865 A1 | 10/2003 | Ponnekanti et al. |
| 2005/0220576 A1 | 10/2005 | Kim et al. |
| 2009/0081005 A1 | 3/2009 | Miyasaka |

FOREIGN PATENT DOCUMENTS

| | | |
|---|---|---|
| JP | 4098338 B2 | 2/2008 |
| JP | 4746027 B2 | 5/2008 |
| JP | 2009-076805 | 4/2009 |
| JP | 2009-088555 | 4/2009 |
| JP | 2009-136981 | 6/2009 |
| JP | 2009-152649 | 7/2009 |
| JP | 2010-021460 | 1/2010 |
| WO | WO 2009/066573 | 5/2009 |

OTHER PUBLICATIONS

Japanese Office Action for corresponding JP Application No. 2012-286828, Feb. 5, 2013.
Japanese Office Action for corresponding JP Application No. 2012-286830, Feb. 5, 2013.
Japanese Office Action for corresponding JP Application No. 2012-286832, Feb. 5, 2013.
Japanese Office Action for corresponding JP Application No. 2012-286837, Feb. 5, 2013.
Japanese Office Action for corresponding JP Application No. 2013-091191, Jul. 29, 2014.

SUBSTRATE TRANSFER SYSTEM, SUBSTRATE PROCESSING SYSTEM, AND SUBSTRATE TRANSFER ROBOT

CROSS-REFERENCE TO RELATED APPLICATIONS

The present application is a divisional application of the U.S. patent application Ser. No. 14/073,871 filed Nov. 7, 2013, which claims priority under 35 U.S.C. §119 to the U.S. Provisional Application No. 61/724,435, filed Nov. 9, 2012. The contents of these applications are incorporated herein by reference in their entirety.

BACKGROUND

1. Field of the Invention

The present invention relates to a substrate transfer system, a substrate processing system, and a substrate transfer robot.

2. Discussion of the Background

Japanese Unexamined Patent Application Publication No. 2009-136981 discloses a substrate transfer system including a substrate transfer robot that transfers a substrate to a different position.

The substrate transfer system disclosed in Japanese Unexamined Patent Application Publication No. 2009-136981 includes a robot (substrate transfer robot) that includes a lower arm, an upper arm, and a hand. The lower arm is rotatable on a horizontal surface relative to a base. The upper arm is rotatable on the horizontal surface relative to the lower arm. The hand is rotatable on the horizontal surface relative to the upper arm. The robot of the substrate transfer system is disposed in a robot installment area defined between a cassette apparatus (first apparatus) and a processing apparatus (second apparatus). The cassette apparatus accommodates substrates, and the processing apparatus processes a substrate.

SUMMARY

According to a first aspect of the present invention, a substrate transfer system includes a substrate transfer robot disposed in a robot installment area defined between a first apparatus and a second apparatus. The first apparatus includes a first cassette, a second cassette and a first wall. Each of the first cassette and the second cassette is disposed in the first apparatus and configured to accommodate at least one substrate. The second apparatus includes a second wall opposite to the first wall to define the robot installment area between the first wall and the second wall. The substrate transfer robot is configured to transfer the at least one substrate from each of the first cassette and the second cassette to the second apparatus. The substrate transfer robot includes a hand configured to support the at least one substrate and an arm. The arm is configured to move the hand. The arm includes a first arm rotatable about a center of rotation. The first cassette is closer to the center of rotation than the second cassette. The substrate transfer robot is configured to transfer the at least one substrate such that the arm moves with being partially disposed beyond the second wall in plan view when the substrate transfer robot takes out the at least one substrate from the first cassette. The substrate transfer robot is configured to take out the at least one substrate from the second cassette such that the arm moves without being disposed beyond the second wall in plan view.

According to a second aspect of the present invention, a substrate processing system includes a first apparatus, a second apparatus, and a substrate transfer robot. The first apparatus includes a first cassette, a second cassette, and a first wall. Each of the first cassette and the second cassette is disposed in the first apparatus and configured to accommodate at least one substrate. The second apparatus includes a second wall opposite to the first wall to define a robot installment area between the first wall and the second wall. The substrate transfer robot is disposed in the robot installment area and configured to transfer the at least one substrate from each of the first cassette and the second cassette to the second apparatus. The substrate transfer robot includes a hand configured to support the at least one substrate and an arm. The arm is configured to move the hand. The arm includes a first arm rotatable about a center of rotation. The first cassette is closer to the center of rotation than the second cassette. The substrate transfer robot is configured to transfer the at least one substrate such that the arm moves with being partially disposed beyond the second wall in plan view when the substrate transfer robot takes out the at least one substrate from the first cassette. The substrate transfer robot is configured to take out the at least one substrate from the second cassette such that the arm moves without being disposed beyond the second wall in plan view.

According to a third aspect of the present invention, a substrate transfer robot includes a hand configured to support a substrate and an arm. The arm is configured to move the hand to transfer the substrate from each of a first cassette and a second cassette of a first apparatus to a second apparatus. Each of the first cassette and the second cassette is disposed in the first apparatus and configured to accommodate at least one substrate. The first apparatus includes a first wall. The second apparatus includes a second wall opposite to the first wall to define a robot installment area between the first wall and the second wall. The arm includes a first arm rotatable about a center of rotation. The first cassette is closer to the center of rotation than the second cassette. The arm is configured to move with being partially disposed beyond the second wall in plan view when taking out the at least one substrate from the first cassette. The arm is configured to take out the at least one substrate from the second cassette such that the arm moves without being disposed beyond the second wall in plan view.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
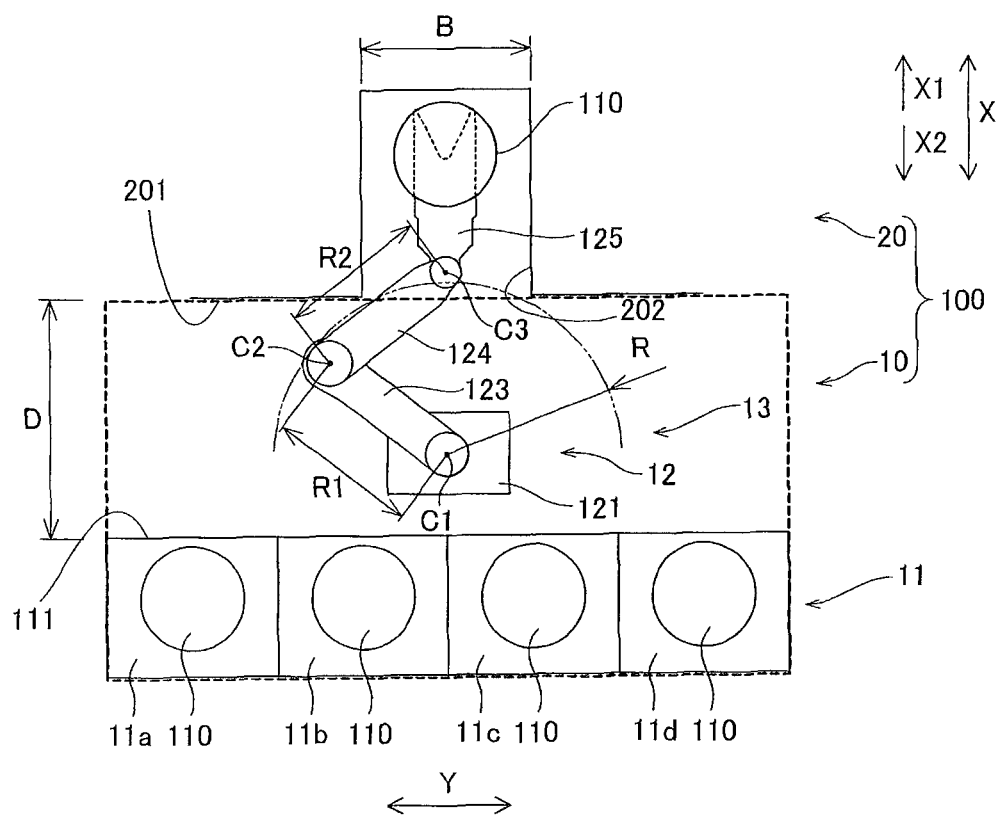
FIG. 1 is a plan view of a substrate processing system according to a first embodiment, illustrating a general arrangement of the substrate processing system.

The embodiments will now be described with reference to the accompanying drawings, wherein like reference numerals designate corresponding or identical elements throughout the various drawings.

First Embodiment

First, by referring to FIGS. 1 to 6, a configuration of a substrate processing system 100 according to the first embodiment will be described.

Figure 2:
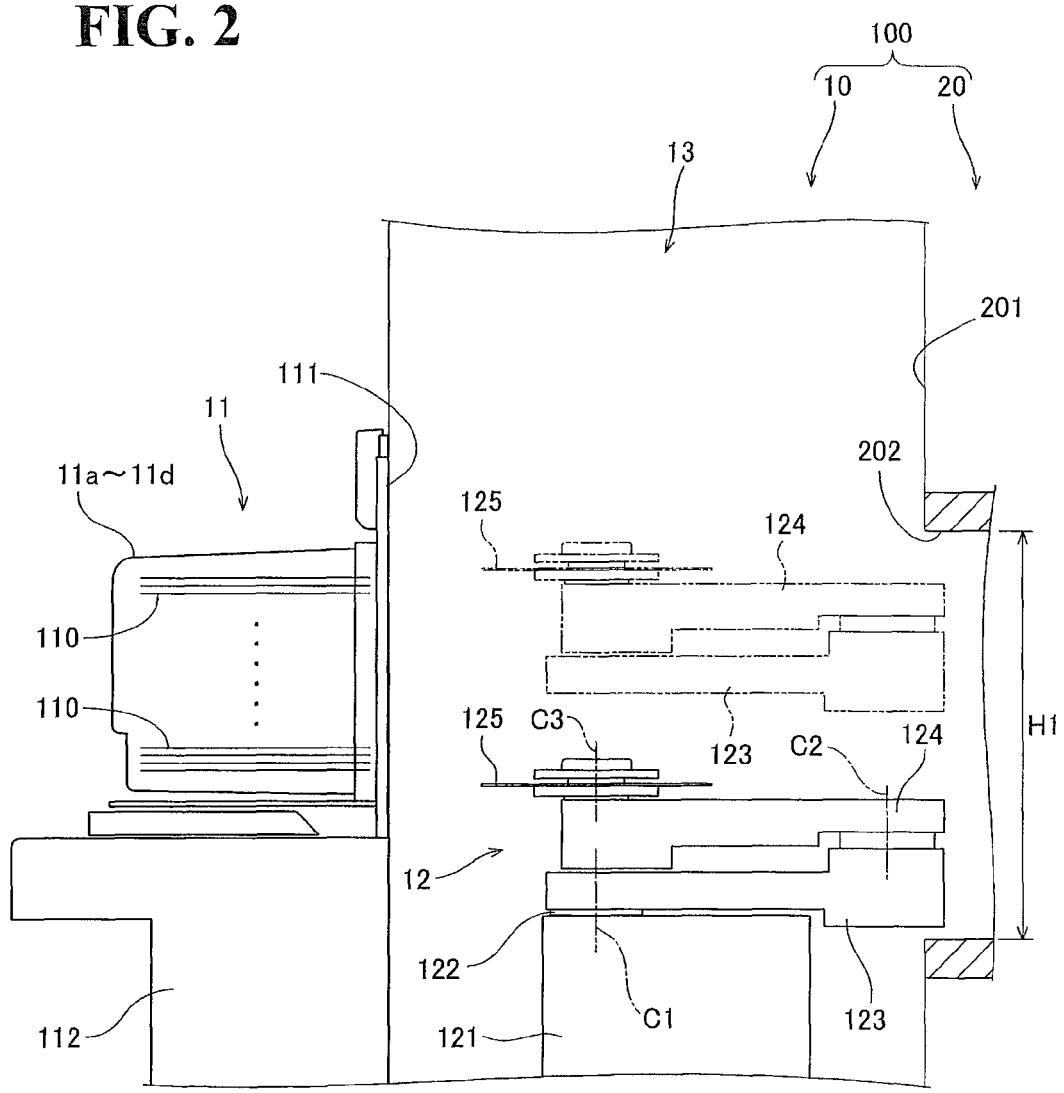
FIG. 2 is a schematic side view of the substrate processing system according to the first embodiment, illustrating a general arrangement of the substrate processing system.

As shown in FIGS. 1 and 2, the substrate processing system 100 includes a substrate transfer system 10 and a processing apparatus 20. The substrate transfer system 10 transfers a substrate 110. In the substrate processing system 100, the substrate transfer system 10 transfers the substrate 110 to the processing apparatus 20. The processing apparatus 20 processes the transferred substrate 110 in a manufacturing process of a semiconductor device.

The substrate transfer system 10 includes a substrate storage apparatus 11 and a substrate transfer robot 12. The substrate storage apparatus 11 accommodates substrates 110, and the substrate transfer robot 12 transfers the substrate 110 between the substrate storage apparatus 11 and the processing apparatus 20. In plan view (when viewed from above), the outer shape of the substrate transfer system 10 is a combination (indicated by the broken line in FIG. 1) of an installment area of the substrate storage apparatus 11 and a robot installment area 13, which is where the substrate transfer robot 12 is disposed, as described later. The robot installment area 13 is defined between a front wall 111, described later, of the substrate storage apparatus 11 and a rear wall 201 of the processing apparatus 20. The substrate transfer system 10 also includes an FFU (Fan Filter Unit), not shown, to keep the air inside the robot installment area 13 clean. The substrate storage apparatus 11 is an example of the "first apparatus", and the processing apparatus 20 is an example of the "second apparatus".

The substrate storage apparatus 11 corresponds to the FOUP (Front Open Unified Pod) of the SEMI (Semiconductor Equipment and Materials International) standard. As shown in FIGS. 1 and 2, the front wall 111 of the substrate storage apparatus 11 is disposed at the side (the X1 direction side) of the substrate transfer robot 12 and the processing apparatus 20. The front wall 111 has a perpendicular surface. The substrate storage apparatus 11 includes four cassettes 11a to 11d disposed at different positions in plan view. The four cassettes 11a to 11d are aligned next to each other in the Y direction. As shown in FIG. 2, the four cassettes 11a to 11d are disposed on a cassette support 112. Also the four cassettes 11a to 11d are each capable of accommodating a plurality of substrates 110 at different height positions. Specifically, each of the four cassettes 11a to 11d has 25 levels of positions in the vertical direction, accommodating a stack of up to 25 substrates 110. The front wall 111 is an example of the "first wall", and each of the positions in the four cassettes 11a to 11d is an example of the "first position".

Figure 3:
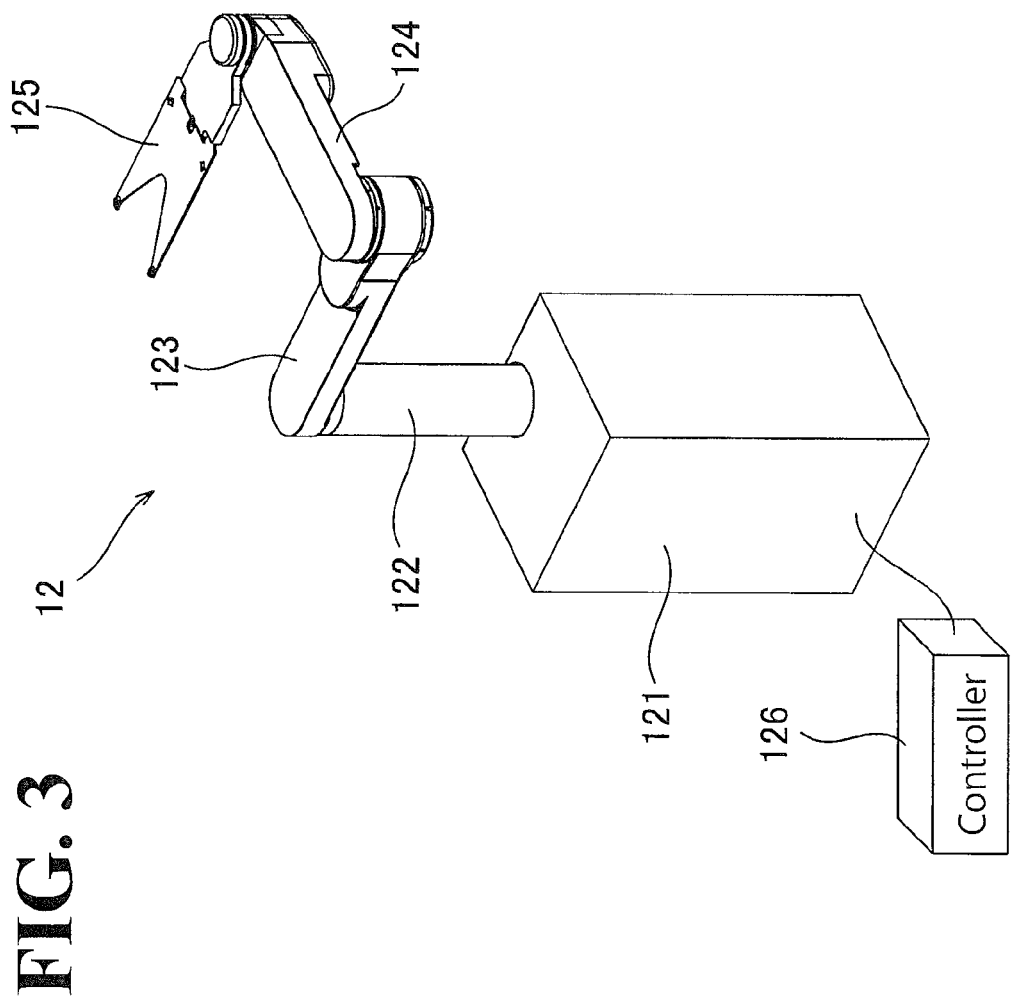
FIG. 3 is a perspective view of a substrate transfer robot of the substrate processing system according to the first embodiment.

As shown in FIGS. 1 to 3, the substrate transfer robot 12 is a multi-articular robot. Specifically, the substrate transfer robot 12 includes a base 121, a support shaft 122, a first arm 123, a second arm 124, a hand 125, and a controller 126. The controller 126 controls these elements of the substrate transfer robot 12. The first arm 123 and the second arm 124 are examples of the "arm".

The support shaft 122 is supported by the base 121 and is elongate in the direction perpendicular to the upper surface of the base 121. At an upper end, the support shaft 122 is coupled to one end of the first arm 123. The first arm 123 is rotatable on a horizontal surface about the support shaft 122 as the center of rotation. At another end, the first arm 123 is coupled to one end of the second arm 124. The second arm 124 is rotatable on the horizontal surface about, as the center of rotation, the one end of the second arm 124 coupled to the first arm 123. At another end, the second arm 124 is coupled to the hand 125. The hand 125 is rotatable on the horizontal surface about, as the center of rotation, the portion of the hand 125 coupled to the second arm 124. Also the hand 125 is capable of supporting the substrate 110 from below the substrate 110. The first arm 123 and the second arm 124 have link lengths approximately equal to one another. Specifically, as shown in FIG. 1, the first arm 123 has a link length R1 from a center C1 of rotation of the first arm 123 to a center C2 of rotation of the second arm 124, while the second arm 124 has a link length R2 from the center C2 of rotation of the second arm 124 to a center C3 of rotation of the hand 125. The link length R1 and the link length R2 are approximately equal to one another. This eliminates or minimizes complexity of the operation control of the elements involved in transfer of the substrate 110, as compared with the case where the link lengths of the first arm 123 and the second arm 124 are different from one another.

The substrate transfer robot 12 moves the support shaft 122 up and down to integrally move the first arm 123, the second arm 124, and the hand 125 up and down. This enables the substrate transfer robot 12 to feed and take the substrate 110 to and from all the different height positions in the cassettes 11a to 11d.

The controller 126 is taught in advance operations of the elements for transfer of the substrate 110 on the hand 125. Specifically, the controller 126 is taught in advance operations of the elements associated with the feeding and taking operations of the substrate 110 to and from the four cassettes 11a to 11d. This ensures that the substrate transfer robot 12 performs a transfer operation with respect to the substrate 110 according to an operation procedure, described later.

As shown in FIGS. 1 and 2, the rear wall 201 of the processing apparatus 20 is disposed at the side (the X2 direction side) of the substrate transfer robot 12 and the substrate storage apparatus 11. The rear wall 201 has a perpendicular surface, and is approximately parallel to and opposed to the front wall 111. On the rear wall 201, an approximately rectangular opening 202 is disposed. As shown in FIG. 1, the opening 202 has an opening width B in the horizontal direction (Y direction). The opening width B is large enough to allow the substrate 110 to be inserted through the opening 202. As shown in FIG. 2, the opening 202 has an opening length H1. The opening length H1 is larger in the height direction (Z direction) than the movable range in the height direction of the first arm 123, the second arm 124, and the hand 125 of the substrate transfer robot 12. Specifically, the opening 202 is open from a first height position through to a second height position. The first height position corresponds to a position at which the substrate transfer robot 12 has access to a lowest position among the 25 levels of positions in the cassettes 11*a* to 11*d*. The second height position corresponds to another position at which the substrate transfer robot 12 has access to a highest position among the 25 levels of positions in the cassettes 11*a* to 11*d*. The rear wall 201 is an example of the "second wall".

Figure 4:
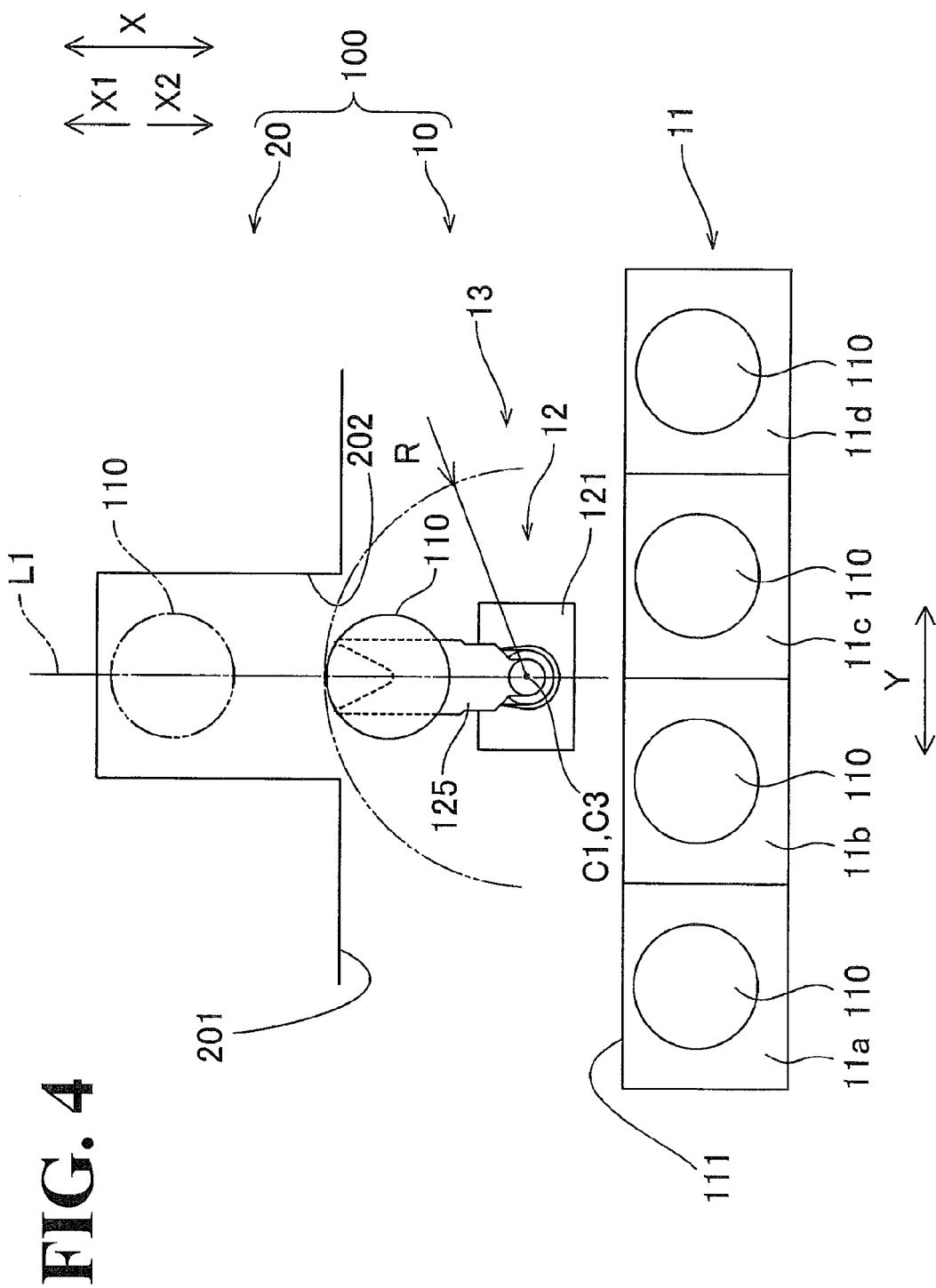
FIG. 4 is a plan view of the substrate processing system according to the first embodiment, illustrating a minimal rotation area of the substrate transfer robot.

Here, in the first embodiment, the substrate transfer robot 12 is capable of transferring a substrate 110 in the substrate storage apparatus 11 to the placement position in the processing apparatus 20 through the opening 202, while at the same time being capable of transferring a substrate 110 in the processing apparatus 20 to a predetermined position in the substrate storage apparatus 11. The substrate transfer robot 12 has a minimal rotation area having an outer periphery that overlaps the inside of the processing apparatus 20 through the opening 202. Specifically, the substrate transfer robot 12 has a minimal rotation radius R, and the minimal rotation radius R is larger than the distance between the center C1 of rotation of the first arm 123 and the rear wall 201 of the processing apparatus 20. As shown in FIG. 4, the minimal rotation area of the substrate transfer robot 12 is an area necessary when the substrate transfer robot 12 takes a normal posture in which the first arm 123, the second arm 124, and the hand 125 supporting the substrate 110 are superimposed over each other and when the substrate transfer robot 12 in the normal posture rotates the first arm 123 on the horizontal surface. The placement position in the processing apparatus 20 is an example of the "second position".

When the substrate transfer robot 12 is in the normal posture, a first distance between the center C1 of rotation of the first arm 123 and the distal end of the first arm 123, a second distance between the center C1 of rotation of the first arm 123 and the distal end of the second arm 124, and a third distance between the center C1 of rotation of the first arm 123 and the distal end of the substrate 110 supported by the hand 125 are approximately equal to each other. Each of the first to third distances is equal to the minimal rotation radius R of the substrate transfer robot 12 and larger than the distance between the center C1 of rotation of the first arm 123 and the rear wall 201.

As shown in FIG. 4, in the substrate transfer robot 12, the center C1 of rotation of the first arm 123 is disposed at a position that faces the opening 202. Specifically, in plan view, the center C1 of rotation of the first arm 123 is disposed on a line L1 extending from the center of the substrate 110 placed at the placement position in the processing apparatus 20 to an approximate center of the opening 202. Also the center C1 of rotation of the first arm 123 is disposed at a position that faces the front wall 111 of the substrate storage apparatus 11. Specifically, in plan view, the center C1 of rotation of the first arm 123 is disposed at a position that faces an approximate center in the Y direction of the four cassettes 11*a* to 11*d* of the substrate storage apparatus 11. Also the center C1 of rotation of the first arm 123 is closer to the front wall 111 of the substrate storage apparatus 11 than to the rear wall 201 of the processing apparatus 20. Between the substrate transfer robot 12 and the substrate storage apparatus 11, a predetermined regulation width is included. The predetermined regulation width is determined depending on an opener (opening and closing mechanism), not shown, that opens and closes the doors of the cassettes 11*a* to 11*d*. A distance D (see FIG. 1) between the substrate storage apparatus 11 and the processing apparatus 20 is larger than a combination of the regulation width of the opener and the distance between the base end of the hand 125 and the distal end of the substrate 110 supported by the hand 125.

Next, an operation procedure of substrate transfer by the substrate transfer system 10 according to the first embodiment will be described.

Figure 5:
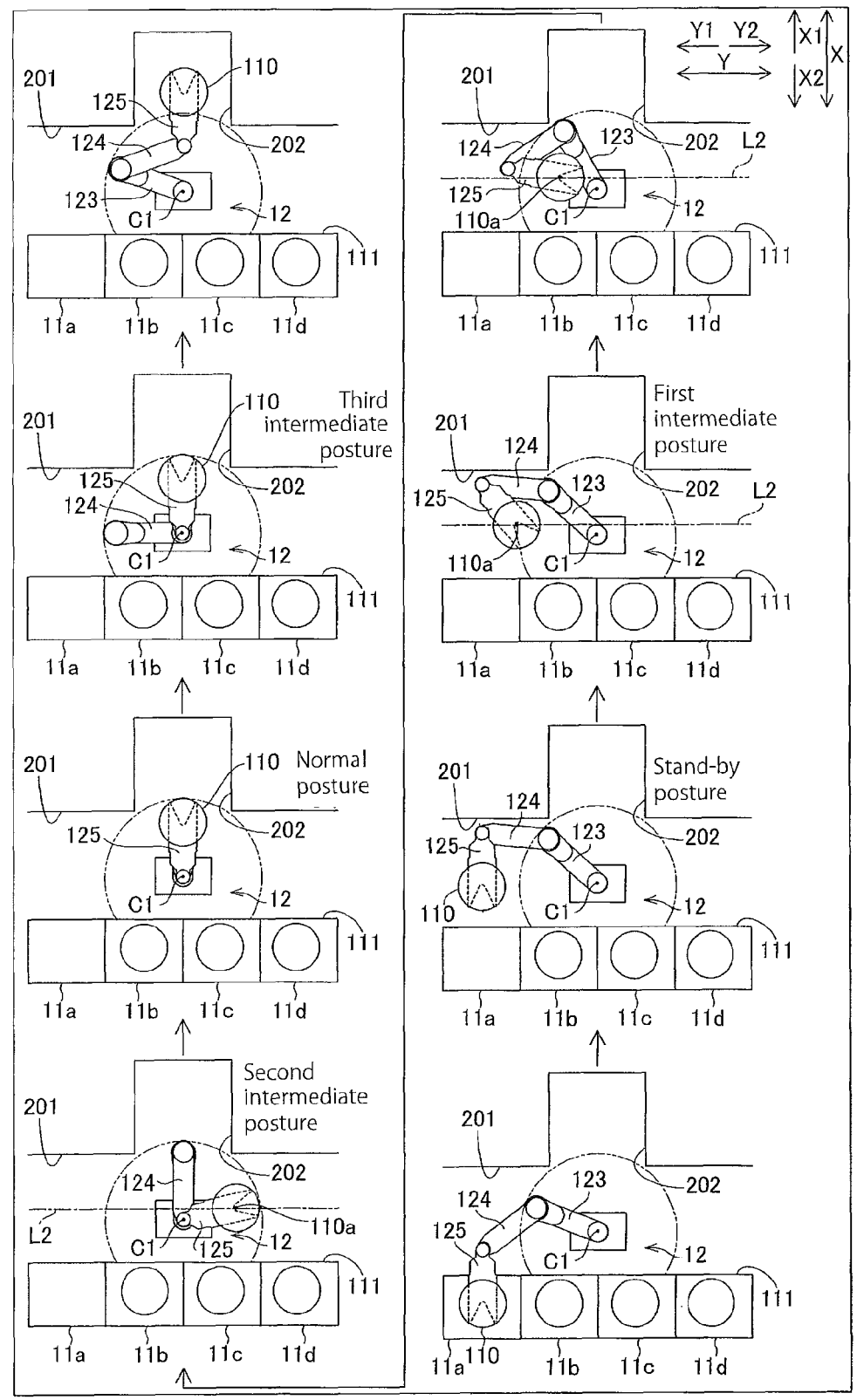
FIG. 5 illustrates a procedure of an operation by the substrate processing system according to the first embodiment in transferring a substrate placed at a position far from the substrate transfer robot.

First, by referring to FIG. 5, description will be made with regard to an operation of transferring a substrate 110 in the cassette 11*a*, which is farther from the substrate transfer robot 12, to the placement position in the processing apparatus 20. As shown in the lower right-hand corner of FIG. 5, the substrate transfer robot 12 moves the hand 125 to a position under a substrate 110 in the cassette 11*a* so as to support the substrate 110. Then, the substrate transfer robot 12 linearly moves the hand 125 toward the processing apparatus 20 (in the X1 direction), thereby pulling the substrate 110 out of the cassette 11*a*, and takes a stand-by posture. Then, the substrate transfer robot 12 rotates the hand 125 alone to put a center 110*a* of the substrate 110 onto an imaginary line L2, thus taking a first intermediate posture. The imaginary line L2 extends in a direction (Y direction) approximately parallel to the rear wall 201 of the processing apparatus 20 in plan view, and is at an approximately equal distance from the front wall 111 and the rear wall 201. In the first intermediate posture, the substrate transfer robot 12 does not protrude into the processing apparatus 20.

The substrate transfer robot 12 changes from the first intermediate posture into a second intermediate posture. Specifically, the substrate transfer robot 12 transfers the substrate 110 with the center 110*a* of the substrate 110 moving along the imaginary line L2, thereby folding the first arm 123 and the second arm 124 together and changing into the second intermediate posture. Here, by folding the first arm 123 and the second arm 124 together, the substrate transfer robot 12 makes the ends of the first arm 123 and the second arm 124 protrude into the processing apparatus 20 through the opening 202.

Then, the substrate transfer robot 12 rotates the hand 125 so as to fold the first arm 123, the second arm 124, and the hand 125 together, thereby changing from the second intermediate posture into the normal posture. Here, the first arm 123, the second arm 124, and the hand 125 are disposed with their lengths oriented in a direction (X direction) orthogonal to the rear wall 201. Also the ends of the first arm 123 and the second arm 124 and a part of the substrate 110 supported by the hand 125 protrude into the processing apparatus 20 through the opening 202.

Then, the substrate transfer robot 12 changes from the normal posture into a third intermediate posture. Specifically, the substrate transfer robot 12 rotates the first arm 123 and the second arm 124 with the first arm 123 and the second arm 124 folded together, thereby making the first arm 123 and the second arm 124 extend in the Y1 direction from the center C1 of rotation of the first arm 123 side and changing into the third intermediate posture. That is, the first arm 123 and the second arm 124 are oriented in one direction (the Y1 direction) among the directions (Y directions) that are orthogonal to the direction (X direction) that is from the center C1 of rotation of the first arm 123 to the placement position in the processing apparatus 20. Also in the third intermediate posture, the substrate 110 supported by the hand 125 is partially beyond the opening 202. Then, the substrate transfer robot 12 changes from the third intermediate posture by linearly moving the hand 125 in the direction (X1 direction) of the placement position in the processing apparatus 20, thereby transferring the substrate 110 to the placement position in the processing apparatus 20.

These movements ensure transfer of the substrate 110 from the cassette 11a to the placement position in the processing apparatus 20 without the substrate transfer robot 12 contacting the substrate storage apparatus 11 and the processing apparatus 20. When transferring the substrate 110 from the placement position in the processing apparatus 20 to the cassette 11a, the substrate transfer robot 12 may follow the above-described operation procedure in reverse order, so as to ensure transfer without the substrate transfer robot 12 contacting the substrate storage apparatus 11 and the processing apparatus 20. When transferring to the placement position in the processing apparatus 20 the substrate 110 in the cassette 11d, which is at the opposite side of the cassette 11a in the Y directions relative to the center the substrate storage apparatus 11, the substrate transfer robot 12 may follow the above-described operation procedure similarly to the cassette 11a, so as to ensure transfer. In the first embodiment, in the third intermediate posture of the substrate transfer robot 12, the first arm 123 and the second arm 124 extend in the Y1 direction from the center C1 of rotation of the first arm 123 in both cases of the cassettes 11a and 11d.

Figure 6:
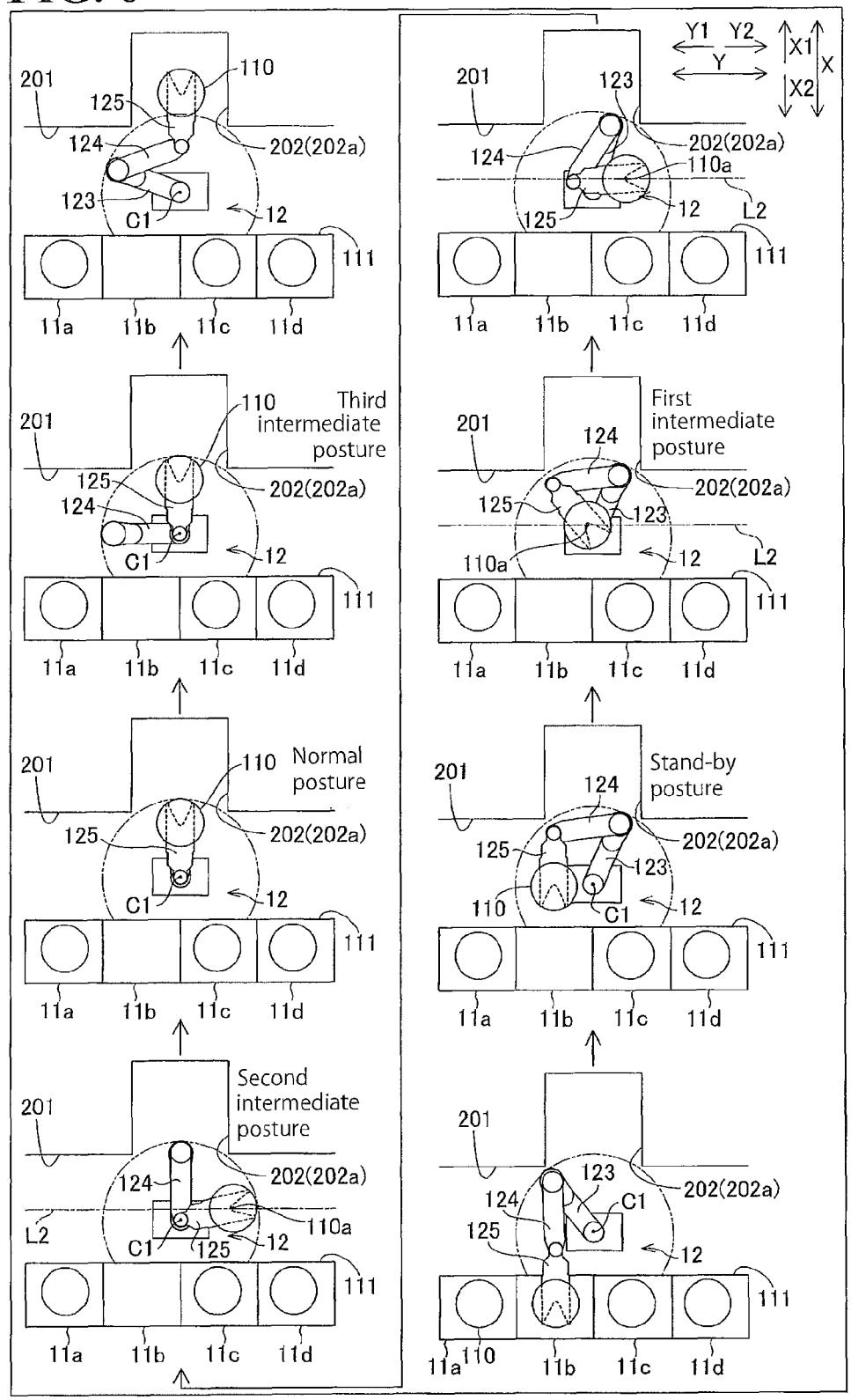
FIG. 6 illustrates a procedure of an operation by the substrate processing system according to the first embodiment in transferring a substrate placed at a position close to the substrate transfer robot.

Next, by referring to FIG. 6, description will be made with regard to an operation of transferring a substrate 110 in the cassette 11b, which is closer to the substrate transfer robot 12, to the placement position in the processing apparatus 20. As shown in the lower right-hand corner of FIG. 6, the substrate transfer robot 12 moves the hand 125 to a position under a substrate 110 in the cassette 11b so as to support the substrate 110. Then, the substrate transfer robot 12 linearly moves the hand 125 toward the processing apparatus 20 (in the X1 direction), thereby pulling the substrate 110 out of the cassette 11b, and takes the stand-by posture. In this state of the substrate transfer robot 12, the ends of the first arm 123 and the second arm 124 protrude into the processing apparatus 20 through the opening 202. Then, the substrate transfer robot 12 rotates the hand 125 alone to put the center 110a of the substrate 110 onto the imaginary line L2, thus taking the first intermediate posture.

The substrate transfer robot 12 changes from the first intermediate posture into the second intermediate posture. Specifically, the substrate transfer robot 12 transfers the substrate 110 with the center 110a of the substrate 110 moving along the imaginary line L2, thereby folding the first arm 123 and the second arm 124 together and changing into the second intermediate posture. Here, by folding the first arm 123 and the second arm 124 together, the substrate transfer robot 12 makes the ends of the first arm 123 and the second arm 124 protrude into the processing apparatus 20 through the opening 202. That is, throughout the stand-by posture, the first intermediate posture, and the second intermediate posture of the substrate transfer robot 12, the ends of the first arm 123 and the second arm 124 protrude into the processing apparatus 20.

Then, the substrate transfer robot 12 rotates the hand 125 so as to fold the first arm 123, the second arm 124, and the hand 125 together, thereby changing from the second intermediate posture into the normal posture. Here, the first arm 123, the second arm 124, and the hand 125 are disposed with their lengths oriented in the direction (X direction) orthogonal to the rear wall 201. Also the ends of the first arm 123 and the second arm 124 and a part of the substrate 110 supported by the hand 125 protrude into the processing apparatus 20 through the opening 202.

Then, similarly to the case of the cassette 11a, the substrate transfer robot 12 takes the third intermediate posture, in which the first arm 123 and the second arm 124 extend in the Y1 direction from the center C1 of rotation of the first arm 123. Then, the substrate transfer robot 12 changes from the third intermediate posture by linearly moving the hand 125 in the direction (X1 direction) of the placement position in the processing apparatus 20, thereby transferring the substrate 110 to the placement position in the processing apparatus 20.

These movements ensure transfer of the substrate 110 from the cassette 11b to the placement position in the processing apparatus 20 without the substrate transfer robot 12 contacting the substrate storage apparatus 11 and the processing apparatus 20. When transferring the substrate 110 from the placement position in the processing apparatus 20 to the cassette 11b, the substrate transfer robot 12 may follow the above-described operation procedure in reverse order, so as to ensure transfer without the substrate transfer robot 12 contacting the substrate storage apparatus 11 and the processing apparatus 20. When transferring to the placement position in the processing apparatus 20 the substrate 110 in the cassette 11c, which is at the opposite side of the cassette 11b in the Y directions relative to the center the substrate storage apparatus 11, the substrate transfer robot 12 may follow the above-described operation procedure similarly to the cassette 11b, so as to ensure transfer. In the first embodiment, in the third intermediate posture of the substrate transfer robot 12, the first arm 123 and the second arm 124 extend in the Y1 direction from the center C1 of rotation of the first arm 123 in both cases of the cassettes 11b and 11c. That is, in all of the cases of the cassettes 11a to 11d, in the third intermediate posture of the substrate transfer robot 12, the first arm 123 and the second arm 124 are oriented in the same direction (the Y1 direction) as viewed from the center C1 of rotation of the first arm 123.

In the first embodiment, the substrate transfer robot 12 transfers the substrate 110 from a position in the substrate storage apparatus 11 to the placement position in the processing apparatus 20 through the opening 202, which is disposed on the processing apparatus 20. Here, with the hand 125 supporting the substrate 110, the outer periphery of the minimal rotation area of the substrate transfer robot 12 overlaps the inside of the processing apparatus 20 through the opening 202. Thus, the opening 202, which is for transfer of the substrate 110 into the processing apparatus 20, is utilized in the rotation of the substrate transfer robot 12. This minimizes the distance between the substrate transfer robot 12 and the processing apparatus 20, as compared with the processing apparatus 20 being disposed to avoid overlapping with the minimal rotation area of the substrate transfer robot 12. This, as a result, diminishes the robot installment area 13 and ensures miniaturization. The diminished robot installment area 13 also ensures a diminished FFU (fan filter unit). This is particularly effective in applications where the robot installment area 13 needs to be kept clean by the FFU, as in the first embodiment. The miniaturization is effective in applications where the substrate processing system 100 accommodates a plurality of apparatuses and is liable to increase in size, as in the first embodiment.

Also in the first embodiment, in the substrate transfer robot 12, the center C1 of rotation of the first arm 123 is at a position that faces the opening 202 in plan view, and the minimal rotation radius R of the substrate transfer robot 12 is larger than the distance between the center C1 of rotation of the first arm 123 and the processing apparatus 20. This configuration ensures that the outer periphery of the minimal rotation area of the substrate transfer robot 12 easily overlaps the inside of the processing apparatus 20 through the opening 202. This, in turn, easily diminishes the robot installment area 13 and ensures miniaturization.

Also in the first embodiment, in the substrate transfer robot 12, the center C1 of rotation of the first arm 123 is closer to the front wall 111 than to the rear wall 201 in plan view, and the minimal rotation radius R of the substrate transfer robot 12 is larger than the distance between the center C1 of rotation of the first arm 123 and the rear wall 201. This configuration reduces the distance between the substrate transfer robot 12 and the front wall 111 as well as reducing the distance between the substrate transfer robot 12 and the rear wall 201. This, in turn, further diminishes the robot installment area 13 and results in further miniaturization.

Also in the first embodiment, the substrate transfer robot 12 takes the normal posture in which the first arm 123, the second arm 124, and the hand 125 supporting the substrate 110 are superimposed over each other in plan view. The substrate transfer robot 12 in the normal posture rotates within the minimal rotation area when the first arm 123 rotates on the horizontal surface about the one end of the first arm 123 as the center C1 of rotation. This configuration eliminates or minimizes enlargement of the minimal rotation area even when the substrate transfer robot 12 is provided with two arms (the first arm 123 and the second arm 124) and the hand 125. This, in turn, eliminates or minimizes enlargement of the robot installment area 13.

Also in the first embodiment, in the normal posture of the substrate transfer robot 12, the first distance between the center C1 of rotation of the first arm 123 and the distal end of the first arm 123, the second distance between the center C1 of rotation of the first arm 123 and the distal end of the second arm 124, and the third distance between the center C1 of rotation of the first arm 123 and the distal end of the substrate 110 supported by the hand 125 are approximately equal to each other. This configuration increases the maximum length of the first arm 123, the second arm 124, and the hand 125 in unfolded state while eliminating or minimizing enlargement of the minimal rotation area of the substrate transfer robot 12. This, in turn, ensures a wide transferable range of the substrate 110 while eliminating or minimizing enlargement of the robot installment area 13.

Also in the first embodiment, when the substrate transfer robot 12 transfers the substrate 110 from a position in the substrate storage apparatus 11 to the placement position in the processing apparatus 20, the substrate transfer robot 12 folds the first arm 123 and the second arm 124 together and protrudes the arm (the first arm 123 and the second arm 124) into the processing apparatus 20 through the opening 202. This configuration facilitates the folding of the first arm 123 and the second arm 124 without the arm of the substrate transfer robot 12 contacting the processing apparatus 20 even though the folding involves overlapping of the arm with the area of the processing apparatus.

Also in the first embodiment, the substrate transfer robot 12 moves the substrate 110 while keeping the center of the substrate 110 along the imaginary line L2, which is approximately parallel to the rear wall 201 of the processing apparatus 20 in plan view, so as to fold the first arm 123 and the second arm 124 together and protrude the arm (the first arm 123 and the second arm 124) into the processing apparatus 20 through the opening 202. This configuration ensures that the substrate 110 is moved with a uniform distance secured from the processing apparatus 20. This, in turn, facilitates the folding of the first arm 123 and the second arm 124 without the substrate 110 contacting the processing apparatus 20.

Also in the first embodiment, the substrate transfer robot 12 rotates the hand 125 supporting the substrate 110 relative to the second arm 124 so as to take the first intermediate posture, in which the center of the substrate 110 is on the imaginary line L2. The substrate transfer robot 12 moves from the first intermediate posture while keeping the center of the substrate 110 along the imaginary line L2 so as to change into the second intermediate posture, in which the first arm 123 and the second arm 124 are folded together. The substrate transfer robot 12 moves from the second intermediate posture so as to transfer the substrate 110 to the placement position in the processing apparatus 20. This configuration easily keeps the center of the substrate 110 on the imaginary line L2 merely by rotating the hand 125, and facilitates the folding of the first arm 123 and the second arm 124 by moving the center of the substrate 110 along the imaginary line L2.

Also in the first embodiment, the imaginary line L2 is at an approximately equal distance from the front wall 111 and the rear wall 201. This configuration ensures that the substrate 110 is moved with a uniform distance secured both from the front wall 111 and the rear wall 201. This, in turn, facilitates the folding of the first arm 123 and the second arm 124 without the substrate 110 contacting the front wall 111 and the rear wall 201.

Also in the first embodiment, when the substrate transfer robot 12 transfers any one substrate 110 in the cassettes 11a to 11d to the placement position in the processing apparatus 20, the substrate transfer robot 12 takes the third intermediate posture, in which with the substrate 110 partially beyond the opening 202, the first arm 123 and the second arm 124 are folded together and oriented in one direction (the Y1 direction) that is approximately orthogonal to the direction (X direction) that is from the center C1 of rotation of the first arm 123 to the placement position in the processing apparatus 20. This configuration ensures that the first arm 123 and the second arm 124 are oriented in the same direction no matter which substrate 110 is transferred. This, in turn, eliminates or minimizes variations of accuracy of substrate transfer caused by a backlash that can occur when, for example, a gear is used to rotate the first arm 123 and the second arm 124.

Also in the first embodiment, the opening 202 is open from a first height position through to a second height position. The first height position corresponds to a position at which the hand 125 and the arm (the first arm 123 and the second arm 124) have access to a substrate 110 placed at a lowest position in the cassettes 11a to 11d of the substrate storage apparatus 11. The second height position corresponds to another position at which the hand 125 and the arm have access to a substrate 110 placed at a highest position in the cassettes 11a to 11d of the substrate storage apparatus 11. This configuration ensures that the substrate transfer robot 12 easily rotates itself by utilizing the opening 202, no matter which height position in the cassettes 11a to 11d the substrate 110 to be transferred by the substrate transfer robot 12 is placed at. This, in turn, ensures that even when the substrates 110 are stacked in the cassettes 11a to 11d, the substrate transfer robot 12 easily transfers the substrate 110 without contacting the processing apparatus 20, while at the same time ensuring a reduction in size of the substrate processing system 100.

Second Embodiment

Next, a second embodiment will be described by referring to FIG. 7. The second embodiment is different from the first embodiment in that an opening 202a according to the second embodiment has an opening length, H2, that is smaller in height (in the Z direction) than the opening length H1 of the opening 202 according to the first embodiment. The same reference numerals designate identical or corresponding elements throughout the first and second embodiments, and these elements will not be elaborated here.

Figure 7:
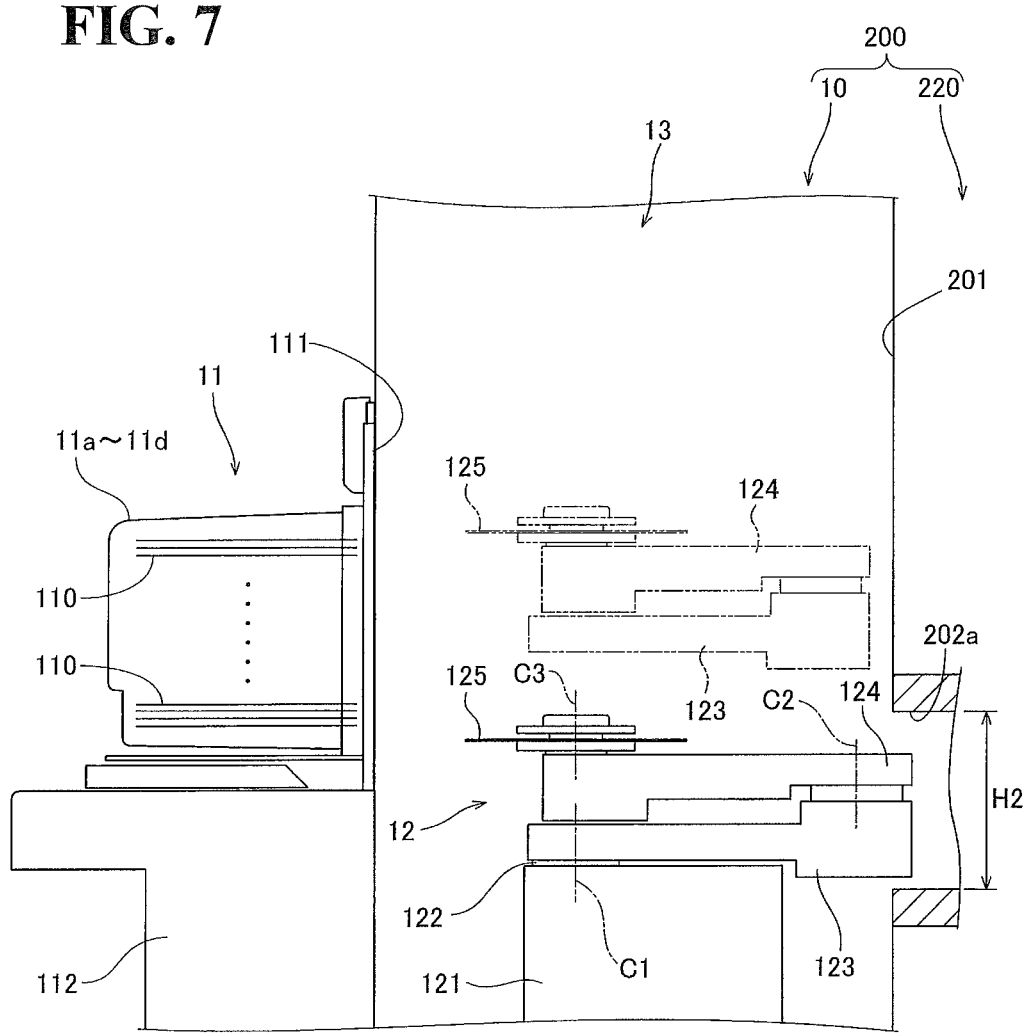
FIG. 7 is a schematic side view of a substrate processing system according to a second embodiment, illustrating a general arrangement of the substrate processing system.

As shown in FIG. 7, a substrate processing system 200 according to the second embodiment includes a processing apparatus 220. The opening 202a of the processing apparatus 220 has the opening length H2. The opening length H2 is smaller than the movable range in the height direction of the first arm 123, the second arm 124, and the hand 125 of the substrate transfer robot 12. Specifically, the opening 202a is open through to a height corresponding to a height position at which the substrate transfer robot 12 has access to the lowest position among the 25 levels of positions in the cassettes 11b and 11c, which are closer to the substrate transfer robot 12. The processing apparatus 220 is an example of the "second apparatus".

Also in the second embodiment, the substrate transfer robot 12 is capable of feeding and taking the substrate 110 to and from all the 25 levels of positions in the cassettes 11a and 11d, which are farther from the substrate transfer robot 12 among the four cassettes 11a to 11d of the substrate storage apparatus 11. For the cassettes 11b and 11c, which are closer to the substrate transfer robot 12 among the four cassettes 11a to 11d of the substrate storage apparatus 11, the substrate transfer robot 12 is capable of feeding and taking the substrate 110 to and from a lowest position among the 25 levels of positions. The position in each of the cassettes 11b and 11c is an example of the "first position", and the position in each of the cassettes 11a and 11d is an example of the "third position".

Next, an operation procedure of substrate transfer by the substrate transfer system 10 according to the second embodiment will be described.

First, by referring to FIG. 5, description will be made with regard to an operation of transferring a substrate 110 in the cassette 11a, which is farther from the substrate transfer robot 12, to the placement position in the processing apparatus 220. Similarly to the first embodiment, the substrate transfer robot 12 moves the hand 125 to a position under a substrate 110 in the cassette 11a so as to support the substrate 110. Then, the substrate transfer robot 12 linearly moves the hand 125 toward the processing apparatus 220 (in the X1 direction), thereby pulling the substrate 110 out of the cassette 11a, and takes the stand-by posture. Here, the substrate transfer robot 12 does not protrude into the processing apparatus 220.

Here, in the second embodiment, the substrate transfer robot 12 in the stand-by posture moves the support shaft 122 up and down to move the first arm 123, the second arm 124, and the hand 125 to a height position corresponding to the opening 202a. This ensures that the substrate transfer robot 12 is able to, in its later movements, protrude the first arm 123, the second arm 124, and the hand 125 into the processing apparatus 220 through the opening 202a. The movements following the stand-by posture are similar to the movements in the first embodiment and will not be elaborated here.

The movements of the substrate transfer robot 12 according to the second embodiment involved in the transfer of a substrate 110 placed at a lowest position in the cassettes 11b and 11c, which are closer to the substrate transfer robot 12, to the placement position in the processing apparatus 220 are similar to the movements in the first embodiment and will not be elaborated here. In the substrate transfer robot 12 according to the second embodiment, it is not possible to transfer substrates 110 other than the substrate 110 at the lowest position in the cassettes 11b and 11c, which are closer to the substrate transfer robot 12; otherwise, the substrate transfer robot 12 would come into contact with the processing apparatus 220.

The second embodiment is otherwise similar to the first embodiment.

In the second embodiment, the opening 202a is open through to a height corresponding to a substrate 110 placed at the cassettes 11b and 11c, which are closer to the substrate transfer robot 12. When the substrate transfer robot 12 seeks access to a position in the cassettes 11a and 11d, which are farther from the substrate transfer robot 12, the substrate transfer robot 12 pulls the substrate 110 out of the cassette 11a or 11d, and then moves the hand 125 and the arm (the first arm 123 and the second arm 124) in the height direction so as to protrude the arm into the processing apparatus 220 through the opening 202a. This configuration diminishes the robot installment area 13 and ensures miniaturization while inhibiting an excessive increase in size of the opening 202a. Inhibiting an excessive increase in size of the opening 202a eliminates or minimizes contamination of the robot installment area 13, in which the air needs to be kept clean, by foreign matter through the opening 202a.

The advantageous effects of the second embodiment are otherwise similar to the advantageous effects of the first embodiment.

Third Embodiment

Next, a third embodiment will be described by referring to FIG. 8. In the third embodiment, a robot installment area 313 is defined between two processing apparatuses 20 and 320, as opposed to the robot installment area 13 according to the first embodiment, which is defined between the substrate storage apparatus 11 and the processing apparatus 20. The same reference numerals designate identical or corresponding elements throughout the first and third embodiments, and these elements will not be elaborated here.

Figure 8:
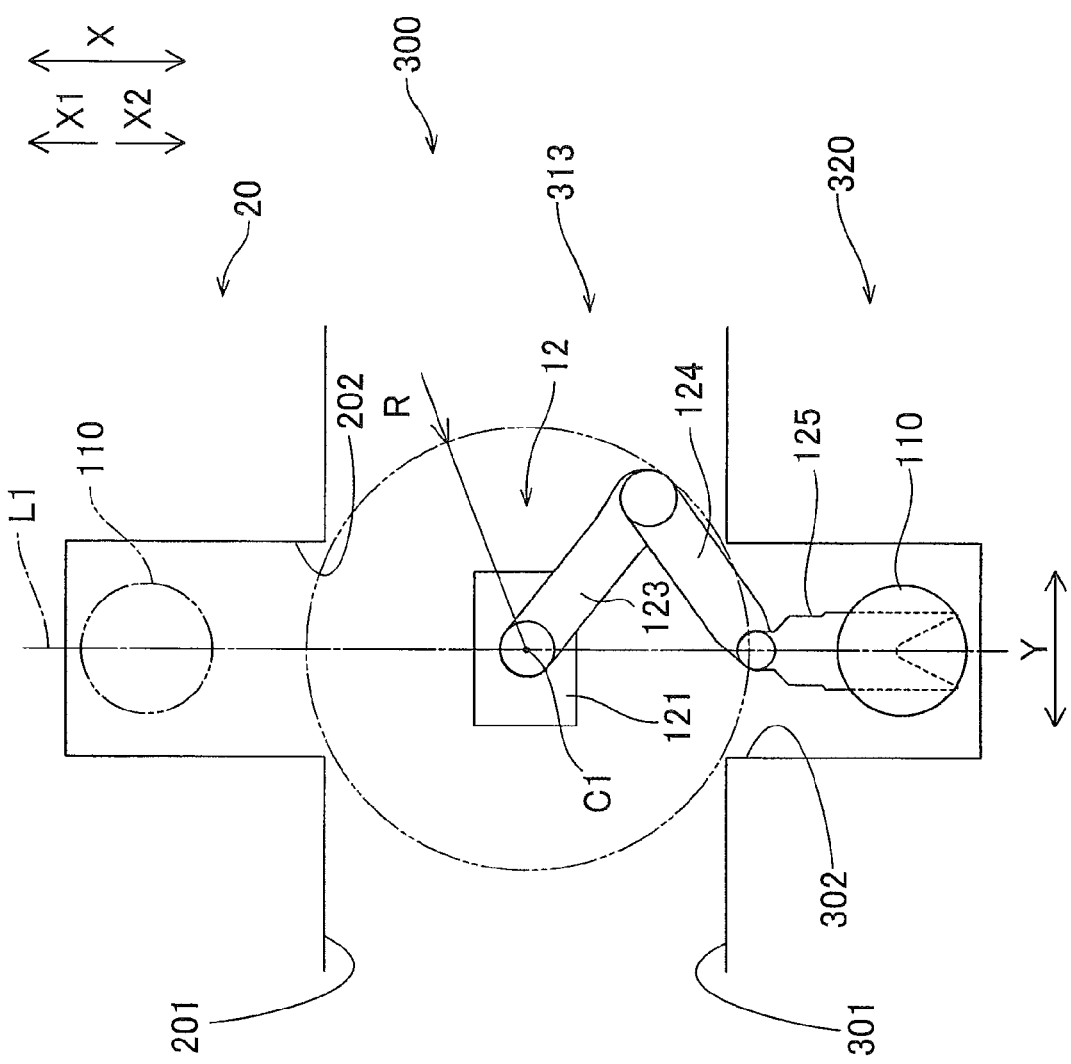
FIG. 8 is a schematic side view of a substrate processing system according to a third embodiment, illustrating a general arrangement of the substrate processing system.

As shown in FIG. 8, in a substrate processing system 300 according to the third embodiment, the two processing apparatuses 20 and 320 are aligned in the X direction and face one another. The processing apparatus 320 has a configuration similar to the configuration of the processing apparatus 20 according to the first embodiment, and is symmetrical relative to the processing apparatus 20 about a center line between the two processing apparatuses 20 and 320. Specifically, the processing apparatus 320 includes a front wall 301 and an opening 302, which respectively correspond to the rear wall 201 and the opening 202 of the processing apparatus 20. The processing apparatus 320 is an example of the "first apparatus", and the front wall 301 is an example of the "first wall".

The robot installment area 313 according to the third embodiment is defined between the rear wall 201 of the processing apparatus 20 and the front wall 301 of the processing apparatus 320. In the robot installment area 313, the substrate transfer robot 12 is disposed. The substrate transfer robot 12 is capable of transferring a substrate 110 between the two processing apparatuses 20 and 320. The substrate transfer robot 12 is disposed at such a position that the outer periphery of the minimal rotation area overlaps the inside of the processing apparatus 20 through the opening 202 of the processing apparatus 20. Also the position of the substrate transfer robot 12 is where the outer periphery of the minimal rotation area overlaps the inside of the processing apparatus 320 through the opening 302 of the processing apparatus 320. That is, the minimal rotation radius R of the substrate transfer robot 12 is larger than the distance between the center C1 of rotation of the first arm 123 and the rear wall 201 of the processing apparatus 20, and is larger than the distance between the center C1 of rotation of the first arm 123 and the front wall 301 of the processing apparatus 320. The substrate transfer robot 12 is capable of 360-degree rotation when in the normal posture, in which the first arm 123, the second arm 124, and the hand 125 are superimposed over each other.

Also in the substrate transfer robot 12, the center C1 of rotation of the first arm 123 is disposed at a position that faces both the openings 202 and 302. Specifically, in plan view, the center C1 of rotation of the first arm 123 is disposed on a line L1 extending from the center of the substrate 110 placed at the placement position in the processing apparatus 20 to an approximate center of the opening 202. Also in the third embodiment, the two processing apparatuses 20 and 320 and the substrate transfer robot 12 are disposed such that the line L1 passes through the center of the substrate 110 at the placement position in the processing apparatus 320 and through an approximate center of the opening 302 of the processing apparatus 320. The center C1 of rotation of the first arm 123 is at an approximately equal distance from the two processing apparatuses 20 and 320. The placement position in the processing apparatus 320 is an example of the "first position".

The third embodiment is otherwise similar to the first embodiment.

In the third embodiment, the substrate transfer robot 12 is disposed in the robot installment area 313 defined between the two opposing processing apparatuses 20 and 320. In this configuration, the outer periphery of the minimal rotation area of the substrate transfer robot 12 overlaps the insides of the processing apparatuses 20 and 320 respectively through the openings 202 and 302. This reduces the distance between the substrate transfer robot 12 and the one processing apparatus 20 and the distance between the substrate transfer robot 12 and the other processing apparatus 320 at the same time. This diminishes the robot installment area 313 and ensures miniaturization of the substrate processing system 300 even when the substrate transfer robot 12 is disposed in the robot installment area 313 defined between the two processing apparatuses 20 and 320.

The advantageous effects of the third embodiment are otherwise similar to the advantageous effects of the first embodiment.

Fourth Embodiment

Next, a fourth embodiment will be described by referring to FIG. 9. The fourth embodiment is different from the first embodiment in that a processing apparatus 420 has two placement positions located in directions approximately orthogonal to one another from the center C1 of rotation of the first arm 123. The same reference numerals designate identical or corresponding elements throughout the first and fourth embodiments, and these elements will not be elaborated here.

Figure 9:
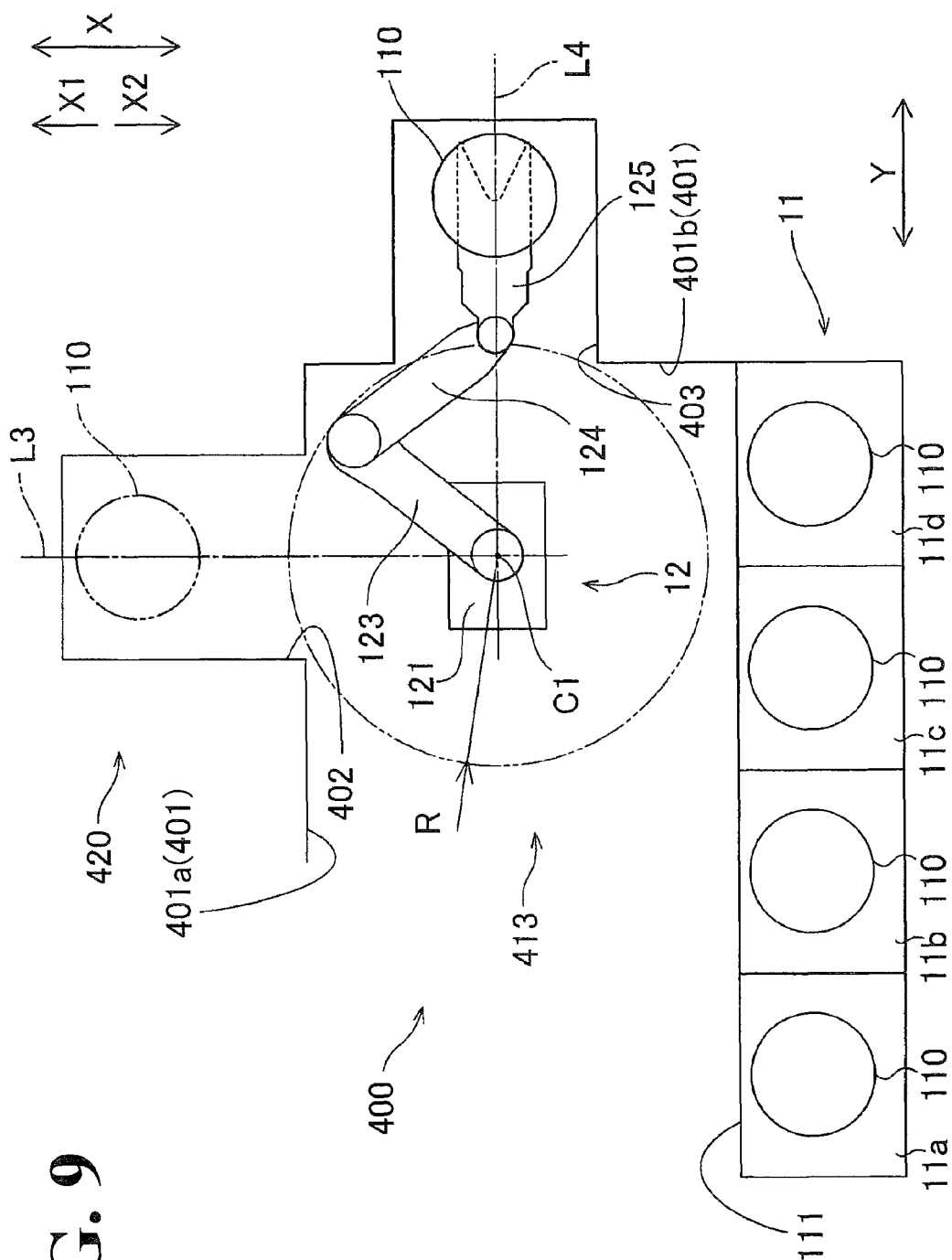
FIG. 9 is a schematic side view of a substrate processing system according to a fourth embodiment, illustrating a general arrangement of the substrate processing system.

As shown in FIG. 9, in a substrate processing system 400 according to the fourth embodiment, the processing apparatus 420 includes an approximately L-shaped wall 401. The wall 401 includes a rear wall 401a and a side wall 401b. The rear wall 401a is approximately parallel to the front wall 111 of the substrate storage apparatus 11, and the side wall 401b is approximately perpendicular to the front wall 111. The rear wall 401a has an approximately rectangular opening 402. The side wall 401b has an approximately rectangular opening 403. The processing apparatus 420 is an example of the "second apparatus", and the rear wall 401a is an example of the "second wall".

In the fourth embodiment, a robot installment area 413 is defined between the front wall 111 of the substrate storage apparatus 11 and the approximately L-shaped wall 401 of the processing apparatus 420. In the robot installment area 413, the substrate transfer robot 12 is disposed. The substrate transfer robot 12 is capable of transferring a substrate 110 among the substrate storage apparatus 11 and two placement positions in the processing apparatus 420. Also the substrate transfer robot 12 is disposed at such a position that the outer periphery of the minimal rotation area overlaps the inside of the processing apparatus 420 through the opening 402 of the rear wall 401a and the opening 403 of the side wall 401b. That is, the minimal rotation radius R of the substrate transfer robot 12 is larger than the distance between the center C1 of rotation of the first arm 123 and the rear wall 401a, and larger than the distance between the center C1 of rotation of the first arm 123 and the side wall 401b. The two placement positions in the processing apparatus 420 are examples of the "second position".

In the substrate transfer robot 12, the center C1 of rotation of the first arm 123 is disposed at a position that faces both the openings 402 and 403. Specifically, in plan view, the center C1 of rotation of the first arm 123 is disposed on a line L3 extending from the center of a substrate 110 placed at one placement position in the processing apparatus 420 to an approximate center of the opening 402 of the rear wall 401a. Also in plan view, the center C1 of rotation of the first arm 123 is disposed on a line L4 extending from the center of a substrate 110 placed at the other placement position in the processing apparatus 420 to an approximate center of the opening 403 of the side wall 401b. The line L3 and the line L4 are approximately orthogonal to one another. The substrate transfer robot 12 is disposed such that the distance between the center C1 of rotation of the first arm 123 and the front wall 111 of the substrate storage apparatus 11 is larger than the minimal rotation radius R. The substrate transfer robot 12 is capable of 360-degree rotation when in the normal posture, in which the first arm 123, the second arm 124, and the hand 125 are superimposed over each other.

The fourth embodiment is otherwise similar to the first embodiment.

In the fourth embodiment, the processing apparatus 420 has two placement positions located in directions approximately orthogonal to one another from the center C1 of rotation of the first arm 123. In this configuration, the outer periphery of the minimal rotation area of the substrate transfer robot 12 overlaps the inside of the processing apparatus 420 through the opening 402 of the rear wall 401a and the opening 403 of the side wall 401b. This reduces both the distance between the substrate transfer robot 12 and the rear wall 401a and the distance between the substrate transfer robot 12 and the side wall 401b. This, in turn, diminishes the robot installment area 413 in two orthogonal directions (X direction and Y direction), the robot installment area 413 being defined by the front wall 111 of the substrate storage apparatus 11, the rear wall 401a, and the side wall 401b, which is approximately orthogonal to the rear wall 401a.

The advantageous effects of the fourth embodiment are otherwise similar to the advantageous effects of the first embodiment.

In the first to fourth embodiments, the substrate transfer robot has been exemplified as including two arms (the first atm and the second arm). This, however, should not be construed in a limiting sense. The substrate transfer robot may include a single arm or three or more arms.

Figure 10:
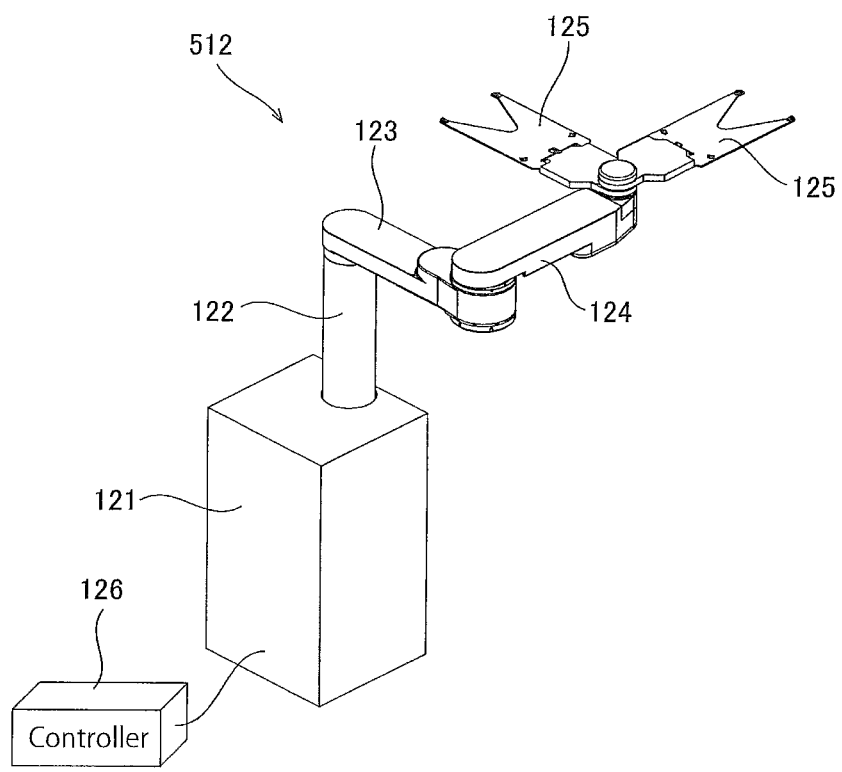
FIG. 10 is a perspective view of a modification of the substrate transfer robot of the substrate processing system according to any of the first to fourth embodiments.

Also in the first to fourth embodiments, the substrate transfer robot has been exemplified as including a single hand. This, however, should not be construed in a limiting sense. As shown in FIG. 10, a substrate transfer robot 512 including two hands is also possible. A substrate transfer robot including three or more hands is also possible.

In the first embodiment, the imaginary line has been exemplified as being at an approximately equal distance from the first wall and the second wall. This, however, should not be construed in a limiting sense. The imaginary line may be closer to either the first wall or the second wall insofar as no interference occurs between the substrate transfer robot and the first and second walls when the substrate transfer robot changes from the first intermediate posture to the second intermediate posture.

Also in the first to fourth embodiments, the robot installment area has been exemplified as being defined between the front wall (first wall) and the rear wall (second wall) that are approximately parallel to one another. This, however, should not be construed in a limiting sense. The robot installment area may be defined between a first wall and a second wall that are orthogonal to one another.

Also in the first to fourth embodiments, the second apparatus has been exemplified as a processing apparatus in a manufacturing process of a semiconductor device. This, however, should not be construed in a limiting sense. The second apparatus may be other than the processing apparatus in a manufacturing process of a semiconductor device. Other examples include a temporary substrate stand apparatus to forward a substrate to a next step.

Also in the first to fourth embodiments, the center of rotation of the first arm has been exemplified as being on a line extending from the center of the substrate placed at the placement position in the processing apparatus (second apparatus) to an approximate center of the opening. This, however, should not be construed in a limiting sense. The center of rotation of the first arm may be off the line extending from the center of the substrate placed at the placement position in the second apparatus to an approximate center of the opening, insofar as the center of rotation of the first arm is disposed at a position that faces the opening.

Also in the first to fourth embodiments, the first distance between the center of rotation of the first arm and the distal end of the first arm, the second distance between the center of rotation of the first arm and the distal end of the second arm, and the third distance between the center of rotation of the first arm and the distal end of the substrate supported by the hand are approximately equal to each other, and the first to third distances are larger than the distance between the center of rotation of the first arm and the rear wall (second wall). This, however, should not be construed in a limiting sense. At least one distance among the first to third distances may be larger than the distance between the center of rotation of the first arm and the second wall.

Also in the first to fourth embodiments, the opening has been exemplified as being provided on the rear wall (second wall) of the processing apparatus serving as the second apparatus. This, however, should not be construed in a limiting sense. For example, it is possible to provide the first apparatus with both a first wall and a second wall provided with an opening. It is also possible to provide a second wall separate from the first apparatus and the second apparatus, and provide an opening on the second wall.

In the first and second embodiments, when the substrate is transferred from any of the cassettes, the first arm and the second arm have been exemplified as being oriented in one direction (in the Y1 direction) from the center of rotation of the first arm in the third intermediate posture. This, however, should not be construed in a limiting sense. To minimize the time spent in transferring the substrate, it is possible in the third intermediate posture to change the orientation of the first arm and the second arm conveniently depending on the position of the cassette.

In the second embodiment, the cassettes 11*b* and 11*c*, which are closer to the substrate transfer robot, have been exemplified as accommodating substrates only at the lowest positions in the cassettes 11*b* and 11*c*, with the opening length H2 of the opening being set at a height corresponding to a position at which the substrate transfer robot has access to the lowest positions in the cassettes 11*b* and 11*c*, which are closer to the substrate transfer robot. This, however, should not be construed in a limiting sense. It is possible to accommodate and stack a plurality of substrates in the cassettes 11*b* and 11*c*, which are closer to the substrate transfer robot, insofar as the opening has a height corresponding to the position at which the substrate transfer robot has access to any of the substrates accommodated in the cassettes 11*b* and 11*c*, which are closer to the substrate transfer robot.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by letters patents of the United States is:

1. A substrate transfer system comprising:
    a substrate transfer robot disposed in a robot installment area defined between a first apparatus and a second apparatus, the first apparatus including a first cassette, a second cassette and a first wall, each of the first cassette and the second cassette being disposed in the first apparatus and configured to accommodate at least one substrate, the second apparatus including a second wall opposite to the first wall to define the robot installment area between the first wall and the second wall, the substrate transfer robot being configured to transfer the at least one substrate from each of the first cassette and the second cassette to the second apparatus, the substrate transfer robot comprising:
    a hand configured to support the at least one substrate; and
    an arm configured to move the hand, the arm including a first arm rotatable about a center of rotation, the first cassette being closer to the center of rotation than the second cassette, the substrate transfer robot being configured to transfer the at least one substrate such that the arm moves with being partially disposed beyond the second wall in plan view when the substrate transfer robot takes out the at least one substrate from the first cassette, the substrate transfer robot being configured to take out the at least one substrate from the second cassette such that the arm moves without being disposed beyond the second wall in plan view.

2. The substrate transfer system according to claim 1, wherein the second wall includes an opening, wherein the first cassette is disposed to face the opening, and wherein the second cassette is disposed without facing the opening.

3. The substrate transfer system according to claim 1, wherein the substrate transfer robot is configured to rotate the hand supporting the at least one substrate relative to the second arm from a first state in which the hand supports the at least one substrate at the first position in the first apparatus so as to take a first intermediate posture in which the center of the at least one substrate is on an imaginary line that is approximately parallel to the second apparatus in plan view, and
wherein, between the first state and the first intermediate posture, the substrate transfer robot is configured to transfer the at least one substrate from the first cassette such that the arm moves with partially entering the opening, and is configured to transfer the at least one substrate from the second cassette such that the arm moves without entering the opening.

4. The substrate transfer system according to claim 3, wherein the substrate transfer robot is configured to move from the first intermediate posture while keeping the center of the at least one substrate along the imaginary line so as to change into a second intermediate posture in which the first arm and the second arm are folded together, and wherein the substrate transfer robot is configured to move from the second intermediate posture so as to transfer the at least one substrate to the second position in the second apparatus.

5. The substrate transfer system according to claim 4, wherein the second wall is disposed at the second apparatus and approximately parallel to the first wall, and wherein the imaginary line is at approximately a same distance from the first wall and the second wall.

6. The substrate transfer system according to claim 4, wherein the first apparatus is configured to accommodate a plurality of substrates at different positions in plan view, and wherein the substrate transfer robot is configured to transfer any one substrate among the plurality of substrates in the first cassette and the second cassette of the first apparatus to the second position in the second apparatus such that with the one substrate partially beyond the opening, the first arm and the second arm are folded together and oriented in one direction that is approximately orthogonal to a direction that is from the center of rotation of the first arm to the second position in the second apparatus after the second intermediate posture.

7. The substrate transfer system according to claim 1, wherein the second wall includes an opening, and wherein the center of rotation of the first arm is at a position that faces the opening in plan view, and the substrate transfer robot comprises a minimal rotation radius larger than a distance between the center of rotation of the first arm and the second apparatus.

8. The substrate transfer system according to claim 7, wherein the center of rotation of the first arm is closer to the first wall than to the second wall in plan view, and the substrate transfer robot comprises a minimal rotation radius larger than a distance between the center of rotation of the first arm and the second wall.

9. The substrate transfer system according to claim 7, wherein the arm comprises a second arm comprising one end coupled to another end of the first arm, the second arm being configured to rotate on a horizontal surface relative to the first arm, wherein the hand is coupled to another end of the second arm and configured to rotate on the horizontal surface relative to the second arm, wherein the substrate transfer robot is configured to take a normal posture in which the first arm, the second arm, and the hand supporting the at least one substrate are superimposed over each other in plan view, and is configured to rotate within the minimal rotation area when the first arm rotates on the horizontal surface about the one end of the first arm as the center of rotation, and wherein with the substrate transfer robot taking the normal posture, at least one distance among a first distance between the center of rotation of the first arm and a distal end of the first arm, a second distance between the center of rotation of the first arm and a distal end of the second arm, and a third distance between the center of rotation of the first arm and a distal end of the at least one substrate supported by the hand is larger than the distance between the center of rotation of the first arm and the second apparatus in plan view.

10. The substrate transfer system according to claim 9, wherein the first distance, the second distance, and the third distance are approximately equal to each other, and each of the first distance, the second distance, and the third distance is larger than the distance between the center of rotation of the first arm and the second apparatus.

11. The substrate transfer system according to claim 9, wherein when the substrate transfer robot transfers the at least one substrate from the first position in the first apparatus to the second position in the second apparatus, the substrate transfer robot is configured to fold the first arm and the second arm together and protrude the arm into the second apparatus through the opening.

12. The substrate transfer system according to claim 11, wherein the substrate transfer robot is configured to transfer the at least one substrate while keeping a center of the at least one substrate along an imaginary line that is approximately parallel to the second apparatus in plan view, so as to fold the first arm and the second arm together and protrude the arm into the second apparatus through the opening.

13. The substrate transfer system according to claim 1, wherein the substrate transfer robot comprises a height direction, and the hand and the arm are configured to move in the height direction, wherein the first apparatus is configured to accommodate a plurality of substrates at different height positions in the first apparatus, and wherein the opening is open from a first height position through to a second height position, the first height position corresponding to a position at which the hand and the arm support one substrate, among the plurality of substrates, that is at a lowest position among the different height positions in the first apparatus, the second height position corresponding to another position at which the hand and the arm support another substrate, among the plurality of substrates, that is at a highest position among the different height positions in the first apparatus.

14. The substrate transfer system according to claim 1, wherein the first apparatus comprises a third position farther from the substrate transfer robot than the first position in plan view, wherein the substrate transfer robot comprises a height direction, and the hand and the arm are configured to move in the height direction within a movable range, wherein the opening has a height range smaller than the movable range, and wherein when the substrate transfer robot transfers one substrate among the plurality of substrates at the third position, the substrate transfer robot is configured to pull the one substrate out of the first apparatus, and move the hand and the arm in the height direction so as to protrude the arm into the second apparatus through the opening.

15. The substrate transfer system according to claim 1, wherein the substrate transfer robot includes a base stationary relative to the robot installment area, and wherein the arm is rotatably mounted to the base to move the hand.

16. The substrate transfer system according to claim 1,
wherein the taking out of the at least one substrate from the first cassette ends prior to the at least one substrate being partially disposed beyond the second wall, and
wherein the taking out of the at least one substrate from the second cassette ends prior to the at least one substrate being partially disposed beyond the second wall.

17. A substrate processing system comprising:
a first apparatus including a first cassette, a second cassette, and a first wall, each of the first cassette and the second cassette being disposed in the first apparatus and configured to accommodate at least one substrate;
a second apparatus including a second wall opposite to the first wall to define a robot installment area between the first wall and the second wall; and
a substrate transfer robot disposed in the robot installment area and configured to transfer the at least one substrate from each of the first cassette and the second cassette to the second apparatus, the substrate transfer robot comprising:
a hand configured to support the at least one substrate; and
an arm configured to move the hand, the arm including a first arm rotatable about a center of rotation, the first cassette being closer to the center of rotation than the second cassette, the substrate transfer robot being configured to transfer the at least one substrate such that the arm moves with being partially disposed beyond the second wall in plan view when the substrate transfer robot takes out the at least one substrate from the first cassette, the substrate transfer robot being configured to take out the at least one substrate from the second cassette such that the arm moves without being disposed beyond the second wall in plan view.

18. The substrate processing system according to claim 17,
wherein the substrate transfer robot includes a base stationary relative to the robot installment area, and
wherein the arm is rotatably mounted to the base to move the hand.

19. A substrate transfer robot comprising:
a hand configured to support a substrate; and
an arm configured to move the hand to transfer the substrate from each of a first cassette and a second cassette of a first apparatus to a second apparatus, each of the first cassette and the second cassette being disposed in the first apparatus and configured to accommodate at least one substrate, the first apparatus including a first wall, the second apparatus including a second wall opposite to the first wall to define a robot installment area between the first wall and the second wall, the arm including a first arm rotatable about a center of rotation, the first cassette being closer to the center of rotation than the second cassette, the arm being configured to move with being partially disposed beyond the second wall in plan view when taking out the at least one substrate from the first cassette, the arm being configured to take out the at least one substrate from the second cassette such that the arm moves without being disposed beyond the second wall in plan view.

20. The substrate transfer robot according to claim 19, further comprising a base stationary relative to the robot installment area,
wherein the arm is rotatably mounted to the base to move the hand.

21. The substrate transfer robot according to claim 19,
wherein the taking out of the at least one substrate from the first cassette ends prior to the at least one substrate being partially disposed beyond the second wall, and
wherein the taking out of the at least one substrate from the second cassette ends prior to the at least one substrate being partially disposed beyond the second wall.

22. The substrate processing system according to claim 17,
wherein the taking out of the at least one substrate from the first cassette ends prior to the at least one substrate being partially disposed beyond the second wall, and
wherein the taking out of the at least one substrate from the second cassette ends prior to the at least one substrate being partially disposed beyond the second wall.

* * * * *